(12) United States Patent
Krans et al.

(10) Patent No.: US 7,982,379 B2
(45) Date of Patent: Jul. 19, 2011

(54) FLEXIBLE DISPLAY DEVICE

(75) Inventors: Martijn Krans, Eindhoven (NL); Erich Zainzinger, Hong Kong (CN); Wouter Bastiaan Zeper, Eindhoven (NL); Thomas Schuler, Leuven (BE); Guido Theo Maria Lamerichs, Leuven (BE); Carla Andrea Parilo, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 220 days.

(21) Appl. No.: 12/303,562

(22) PCT Filed: Jun. 5, 2007

(86) PCT No.: PCT/IB2007/052103
§ 371 (c)(1),
(2), (4) Date: Dec. 5, 2008

(87) PCT Pub. No.: WO2007/141729
PCT Pub. Date: Dec. 13, 2007

(65) Prior Publication Data
US 2010/0253216 A1    Oct. 7, 2010

(30) Foreign Application Priority Data
Jun. 8, 2006  (EP) .................................... 06115160

(51) Int. Cl.
*H01J 7/24*   (2006.01)
*H01J 9/00*   (2006.01)

(52) U.S. Cl. ............................. 313/46; 313/511; 445/24
(58) Field of Classification Search .................... None
See application file for complete search history.

(56) References Cited

U.S. PATENT DOCUMENTS

| | | | |
|---|---|---|---|
| 5,990,618 A * | 11/1999 | Morita et al. | 313/582 |
| 2002/0113534 A1 * | 8/2002 | Hayashi et al. | 313/113 |
| 2003/0052594 A1 | 3/2003 | Matsui et al. | |
| 2003/0072153 A1 | 4/2003 | Matsui et al. | |
| 2005/0225222 A1 * | 10/2005 | Mazzochette et al. | 313/46 |
| 2007/0053179 A1 * | 3/2007 | Pang et al. | 362/103 |
| 2007/0236934 A1 * | 10/2007 | Chang et al. | 362/294 |
| 2009/0200938 A2 * | 8/2009 | Zhu et al. | 313/506 |

FOREIGN PATENT DOCUMENTS

| | | |
|---|---|---|
| JP | 2005174754 A | 6/2005 |
| WO | 0210809 A1 | 2/2002 |
| WO | 2004100111 A2 | 11/2004 |

* cited by examiner

*Primary Examiner* — Ashok Patel

(57) ABSTRACT

The present invention relates to a flexible display device (10) comprising a flexible substrate (12) having at least one light source (14) mounted thereon. The flexible display device is characterized by a flexible thermo regulating layer (20) provided on the opposite side of the substrate compared to the side with the at least one light source for dissipating heat from the remaining display device. This allows for stable operation and increased endurance of the display device. The present invention also relates to a textile product comprising such a flexible display device, and a method for the manufacturing of such a flexible display device.

7 Claims, 1 Drawing Sheet

FLEXIBLE DISPLAY DEVICE

TECHNICAL FIELD OF THE INVENTION

The present invention relates to a flexible display device comprising a flexible substrate having at least one light source mounted thereon. The present invention also relates to a textile product comprising such a flexible display device, and a method for the manufacturing of such a flexible display device.

BACKGROUND OF THE INVENTION

An example of such a flexible display device is disclosed in the document WO2004/100111. The flexible display device in WO2004/100111 comprises a fabric support with woven threads including electrically conductive threads, and discrete electro luminescent sources soldered to the conductive threads. The flexible display device can be used in for example garments, allowing a viewer to see graphical shapes, text based characters, etc. on the garment display.

However, during operation of a flexible display device, the light sources and associated components and elements may generate considerable heat. This in turn may hamper the operation of the flexible display device, since the output of the light sources usually depends on temperature. It may also reduce the useful life of the display, since elevated temperatures usually accelerates the degradation of the electrical components of the display.

SUMMARY OF THE INVENTION

It is an object of the present invention to overcome or at least alleviate this problem, and to provide an improved flexible display device.

This and other objects that will be evident from the following description are achieved by means of a flexible display device, a textile product comprising such a flexible display device, and a method for the manufacturing of such a display device, according to the appended claims.

According to an aspect of the invention, there is provided a flexible display device comprising flexible substrate having at least one light source mounted thereon, the flexible display device being characterized by a flexible thermo regulating layer provided on the opposite side of the substrate compared to the side with the at least one light source.

By providing a flexible thermo regulating layer to the substrate, heat may be dissipated from the substrate and light source(s) and other possible display components, which allows for consistent operation and increased endurance of the display device. Further, using a flexible thermo regulating layer allows the display device to maintain its overall flexible nature.

In one embodiment, the thermo regulating layer is made of a non-stretchable material, such as Neoprene. The non-stretchable layer offers physical strength protection against damage to the flexible display substrate. For instance, it allows for "stretch protection" of a non-stretchable display substrate, which is especially advantageous in case the display device is attached to a stretchable material, such as the fabric of a garment.

In one embodiment, the thermo regulating layer comprises holes, for guiding heat away from the display device, and thus produce the heat absorbing property of the thermo regulating layer. To this end, the holes may be arranged in a repetitive pattern.

In one embodiment, a breathable fabric layer is provided on the opposite side of the thermo regulating layer compared to the side facing the flexible substrate. The breathable fabric layer allows heat to be transferred out from the flexible display device, while still providing an outer surface with a fabric feel, which may be advantageous in case the flexible display device is incorporated in a textile product such as a garment. The breathable fabric layer may also be waterproof, to protect the display device from moisture.

In one embodiment, a reflective fabric layer is provided between the flexible substrate and the thermo-regulating layer, so that any light emitted backwards from the light sources is reflected forward. The reflective fabric layer may for example be white or silver Lycra.

Preferably, the above-mentioned layers may be attached together by means of lamination. Alternatively, they may be attached by means of gluing, stitching, or the like. The joined layers may then be laminated to the backside of the flexible substrate.

According to another aspect of the invention, there is provided a textile product comprising a flexible display device according to the above description. This aspect offers similar advantages as obtained with the previously discussed aspect of the invention. The textile product may for example be a garment, pillow, curtain, furnishing fabric, vehicle ceiling, bed textile, toy, mat or carpet, table cloth, pouch, bag, backpack, or the like.

According to another aspect of the invention, there is provided method for the manufacturing of a flexible display device, comprising providing a flexible substrate having at least one light source mounted thereon, the method being characterized by providing a flexible thermo regulating layer on the opposite side of the substrate compared to the side with the at least one light source. This method offers similar advantages as obtained with the previously discussed aspects of the invention.

BRIEF DESCRIPTION OF THE DRAWINGS

These and other aspects of the present invention will now be described in more detail, with reference to the appended drawings showing a currently preferred embodiment of the invention.

DETAILED DESCRIPTION OF EMBODIMENTS

Figure 1:
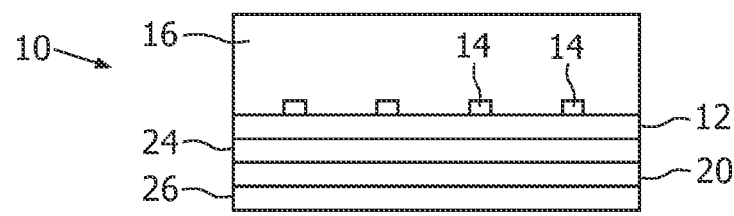
FIG. 1 is a cross-sectional side view of a flexible display device according to the invention.

FIG. 1 is a cross-sectional side view of a flexible display device 10 according to an embodiment of the invention. The flexible display device 10 comprises a flexible substrate 12, which for example can be made of plastics or fabrics, and a plurality of discrete light sources 14, preferably light emitting diodes (LEDs). The flexible display device 10 may optionally comprise a diffusing element 16 arranged to receive and diffuse light emitted from the light sources 14 of the flexible display device 10. An example of such a flexible display device with diffusing element is for example disclosed in the above-mentioned document WO2004/100111.

Figure 2:
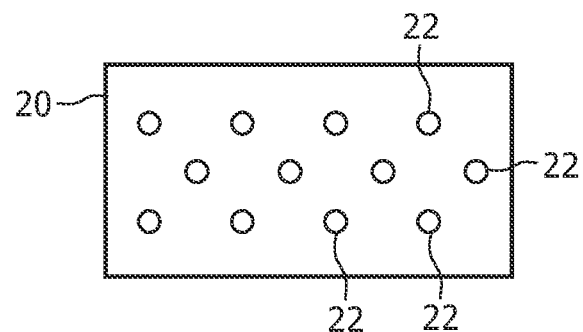
FIG. 2 is a top view of the thermo regulating layer in the flexible display device in FIG. 1.

According to the present invention, the flexible display device 10 further comprises a flexible thermo regulating layer 20 provided on the opposite side of the flexible substrate 12 compared to the side with the light sources 14. The flexible thermo regulating layer 20 is preferably made of a non-stretchable material, preferably Neoprene. Alternatively, the layer 20 can be made of an elastomer, such as silicone. Advantageously, the thermo regulating layer 20 comprises holes 22, to produce the heat absorbing property of the thermo regulating layer 20. To this end, the holes 22 may be arranged in a repetitive, "zigzag" pattern, as illustrated in FIG. 2. The pattern in FIG. 2 is designed to provide good performance in terms of heat flow, flexibility, and strength for a typical embodiment.

Also, a breathable fabric layer 26 may be provided on the opposite side of the thermo regulating layer 20 compared to the side facing the flexible substrate 12. The breathable fabric layer 26 allows heat to be transferred out from the display device 10, but not the other way around. Preferably, the breathable fabric layer 26 is also water repellant, in order to protect the rest of the display device 10 from any moisture in its surroundings. The breathable water repellant layer 26 may for example be GoreTex, or another similar material.

A reflective fabric layer 24 may further be provided between the flexible substrate 12 and the thermo-regulating layer 20, so that any light emitted backwards from the light sources 14 is reflected forward. The reflective fabric layer 24 may for example be white or silver Lycra.

Also, a back cover (not shown) having larger area than the remaining flexible display device 10 can be attached to the back of the same, to facilitate attachment (for instance by stitching) of the flexible display device 10 to a textile product. A different fabric back layer, not tightly attached to the display device, but for instance the inner lining of a garment, could be a heat protective fabric layer. For example, the heat protective fabric layer could be an aluminum-coated fabric. Such a heat protective fabric layer will protect the wearer of a garment incorporating the display device from the heat generated by the display.

Figure 3:
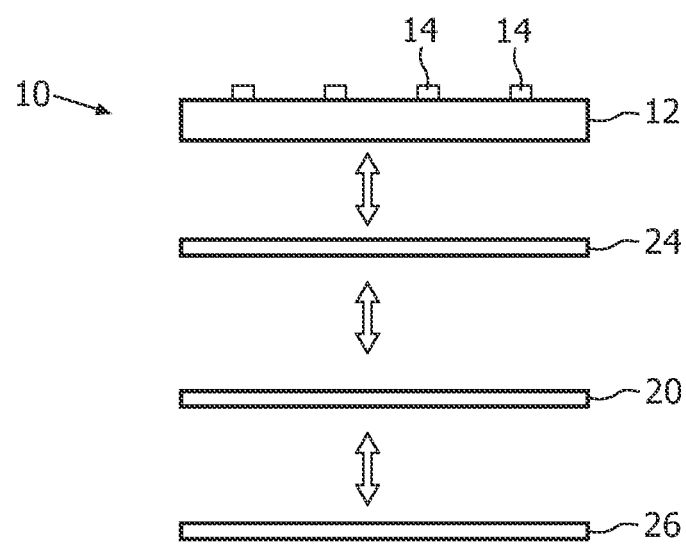
FIG. 3 is a schematic illustration of steps of the manufacturing of the flexible display device in FIG. 1.

The above mentioned layers 20, 24, 26 may be attached together by means of lamination, and may then be laminated to the backside of the flexible substrate 12, as illustrated schematically in FIG. 3. The arrows in the figure each indicate a lamination step. Alternatively, the layers may be attached together by means of gluing, stitching, or the like. The back cover constituted by the above-mentioned layers 24, 26 thus performs three functions at the same time, it allows for heat dissipation, moisture protection, and stretch protection.

The flexible display device 10 according to the present invention may advantageously be incorporated in a textile product, such as a garment or pillow, allowing a viewer to see graphical shapes, text based characters, etc. on the textile product.

The person skilled in the art realizes that the present invention by no means is limited to the preferred embodiments described above. On the contrary, many modifications and variations are possible within the scope of the appended claims.

The invention claimed is:

1. A flexible display device, comprising:
    a flexible substrate having at least one light source mounted thereon,
    characterized by:
    a flexible thermo regulating layer disposed on the opposite side of the substrate compared to the side with the at least one light source for dissipating heat from the remaining display device, and
    a breathable fabric is disposed on the opposite side of the thermo-regulating layer compared to the side facing the flexible substrate.

2. A flexible display device according to claim 1, wherein the thermo regulating layer is made of a of non-stretchable material.

3. A flexible display device according to claim 1, wherein the thermo-regulating layer comprises holes for guiding heat away from the display device.

4. A textile product comprising a flexible display device according to claim 1.

5. A flexible display device according to claim 1, wherein the breathable fabric is water repellant.

6. A flexible display device according to claim 1, wherein a reflective fabric layer is disposed between the flexible substrate and the thermo-regulating layer.

7. A method for the manufacturing of a flexible display device, comprising:
    providing a flexible substrate having at least one light source mounted thereon,
    characterized by:
    providing a flexible thermo regulating layer on the opposite side of the substrate compared to the side with the at least one light source for dissipating heat from the remaining display device, and
    providing a breathable fabric the opposite side of the thermo-regulating layer compared to the side facing the flexible substrate.

* * * * *